(12) United States Patent
Bijvoet

(10) Patent No.: US 7,355,677 B2
(45) Date of Patent: Apr. 8, 2008

(54) SYSTEM AND METHOD FOR AN IMPROVED ILLUMINATION SYSTEM IN A LITHOGRAPHIC APPARATUS

(75) Inventor: Dirk-Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 91 days.

(21) Appl. No.: 11/007,588

(22) Filed: Dec. 9, 2004

(65) Prior Publication Data
US 2006/0126047 A1   Jun. 15, 2006

(51) Int. Cl.
G03B 27/54 (2006.01)

(52) U.S. Cl. .................. 355/67; 355/71; 359/224; 359/290; 359/872

(58) Field of Classification Search .................. 355/53, 355/67, 71
See application file for complete search history.

(56) References Cited

U.S. PATENT DOCUMENTS

| | | | |
|---|---|---|---|
| 4,954,789 A * | 9/1990 | Sampsell | 359/318 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,728,017 B2 * | 4/2004 | Park | 359/224 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,906,848 B2 * | 6/2005 | Aubuchon | 359/291 |
| 2002/0114558 A1 * | 8/2002 | Nemirovsky | 385/18 |
| 2003/0169962 A1 * | 9/2003 | Rajan et al. | 385/18 |
| 2004/0041104 A1 | 3/2004 | Liebregts et al. | |
| 2004/0069742 A1 * | 4/2004 | Pan | 216/24 |
| 2004/0130561 A1 | 7/2004 | Jain | |
| 2004/0240033 A1 * | 12/2004 | Pan et al. | 359/291 |
| 2005/0007572 A1 | 1/2005 | George et al. | |
| 2005/0041277 A1 * | 2/2005 | Huibers | 359/286 |
| 2005/0191790 A1 * | 9/2005 | Patel et al. | 438/107 |
| 2006/0056005 A1 * | 3/2006 | Patel et al. | 359/291 |
| 2007/0047113 A1 * | 3/2007 | Davis et al. | 359/849 |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—D. Rutledge
(74) *Attorney, Agent, or Firm*—Sterne, Kessler, Goldstein & Fox P.L.L.C

(57) ABSTRACT

An array of individually controllable elements for use in lithography in which each of the individually controllable elements is comprised of a planar reflector mounted on supports on a substrate by way of elongate hinges.

13 Claims, 11 Drawing Sheets

SYSTEM AND METHOD FOR AN IMPROVED ILLUMINATION SYSTEM IN A LITHOGRAPHIC APPARATUS

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

It is known to use, as an array of individually controllable elements, an array of mirrors in a matrix arrangement. Each of the mirrors can be individually tilted about an axis by applying a suitable localized electric field or by employing piezo-electric actuation means. The mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The matrix addressing can be performed using suitable electronic means. In order to manufacture ever-smaller devices using lithography, it is necessary to reduce the size of the individually controllable elements that generate the pattern. However, as the individually controllable elements decrease in size, the mechanical stress at the hinges that support the individually controllable elements increases. Accordingly, the lifetime of the hinges, and the lifetime of the array of individually controllable elements, decreases. Furthermore, the size of the actuation force required to position an individually controllable element at a required location can also increase.

Therefore, what is needed is a system and method that allows an array of individually controllable elements to be formed in which the size of the individually controllable elements can be reduced.

SUMMARY

According to an embodiment of the present invention, there is provided a lithographic apparatus comprising an illumination system, an array of individually controllable elements, and a projection system. The illumination system supplies a beam of radiation. The array of individually controllable elements patterns the beam. The projection system projects the patterned beam onto a target portion of a substrate. The array of individually controllable elements includes a substrate having a plurality of supports on which the individually controllable elements are mounted. The individually controllable elements each comprise a planar reflector, having a reflective surface substantially located in a reflecting plane, and at least two elongate hinges. The hinges are each connected at one end to the planar reflector and at the other end to one of the supports on the substrate.

Another embodiment of the present invention provides an array of individually controllable elements, which are configured to pattern a beam of radiation. Each individually controllable element comprises a planar reflector, which has a reflective surface substantially located in a reflecting plane, and at least two elongate hinges, and a substrate having a plurality of supports on which the individually controllable elements are mounted. The hinges are each connected at one end to the planar reflector and at the other end to one of the supports on the substrate.

A further embodiment of the present invention provides a device manufacturing method comprising the following steps. Patterning a beam of radiation using an array of individually controllable elements. Projecting the patterned beam of radiation onto a target portion of a substrate. The array of individually controllable elements includes a substrate having a plurality of supports on which the individually controllable elements are mounted. The individually controllable elements each comprise a planar reflector, which has a reflective surface substantially located in a reflecting plane, and at least two elongate hinges. The hinges are each connected at one end to the planar reflector and at the other end to one of the supports on the substrate. The planar reflectors are actuated to position them as necessary to impart the pattern to the beam.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 3:
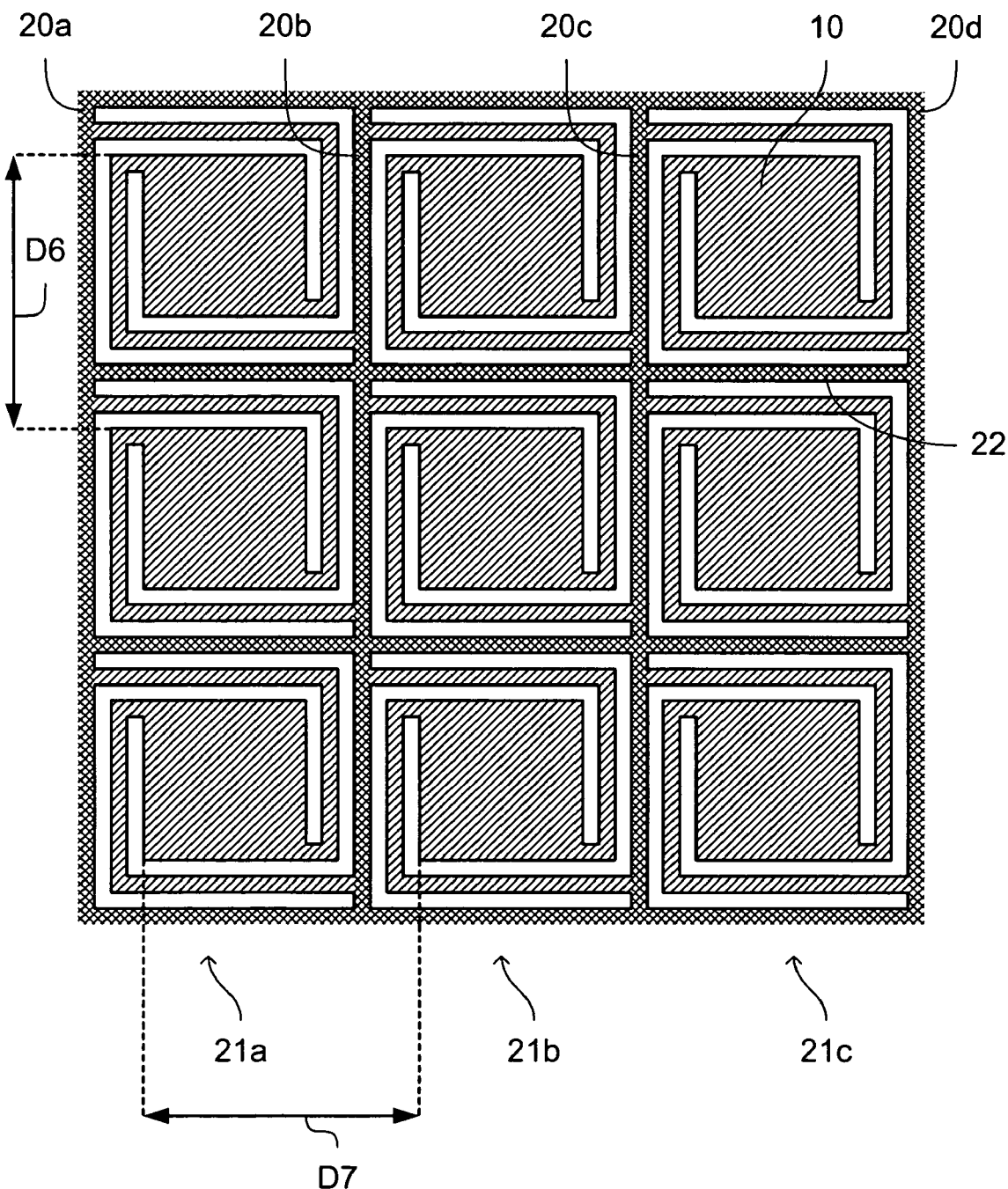
Figure 4:
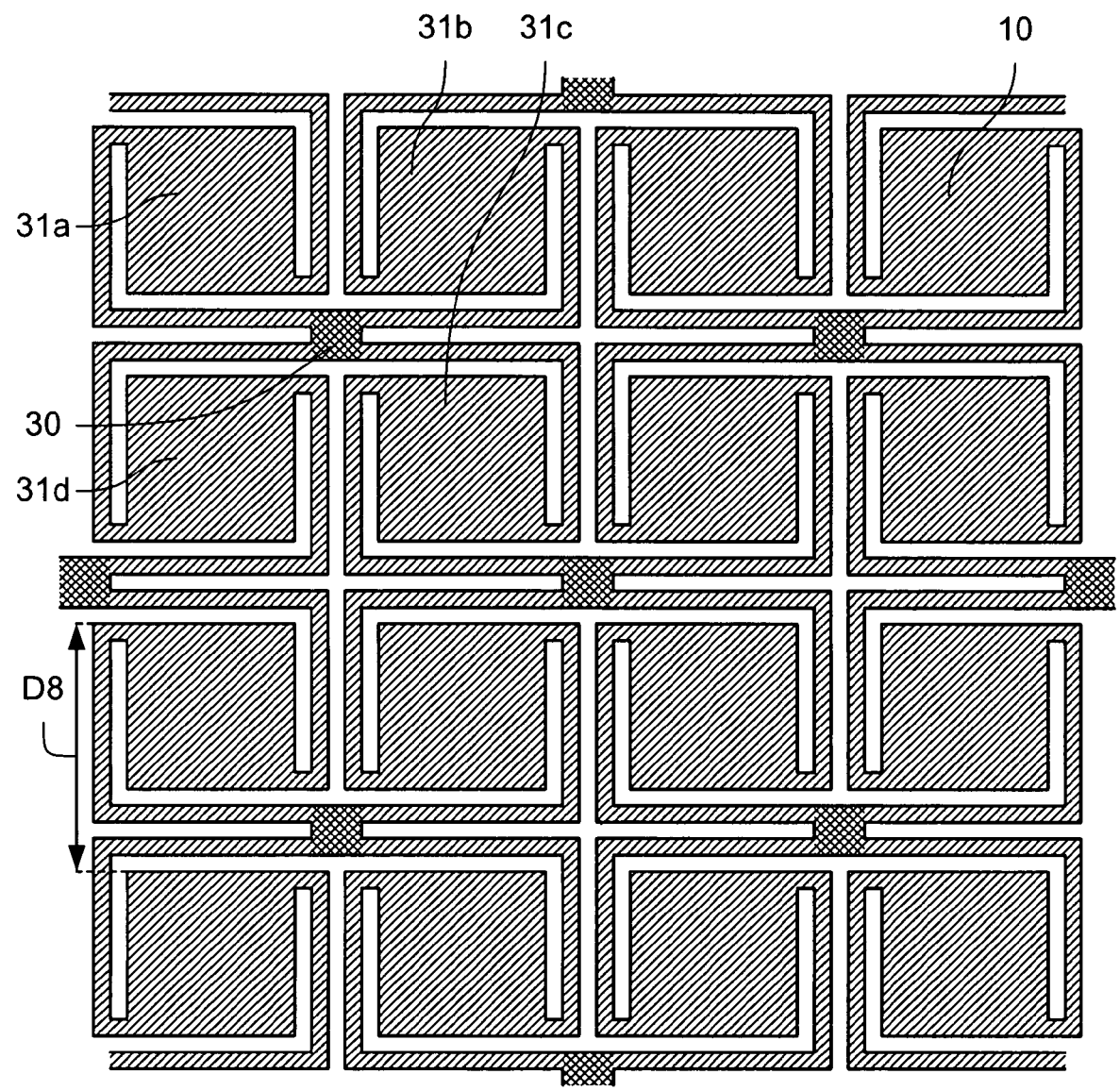
Figure 5A:
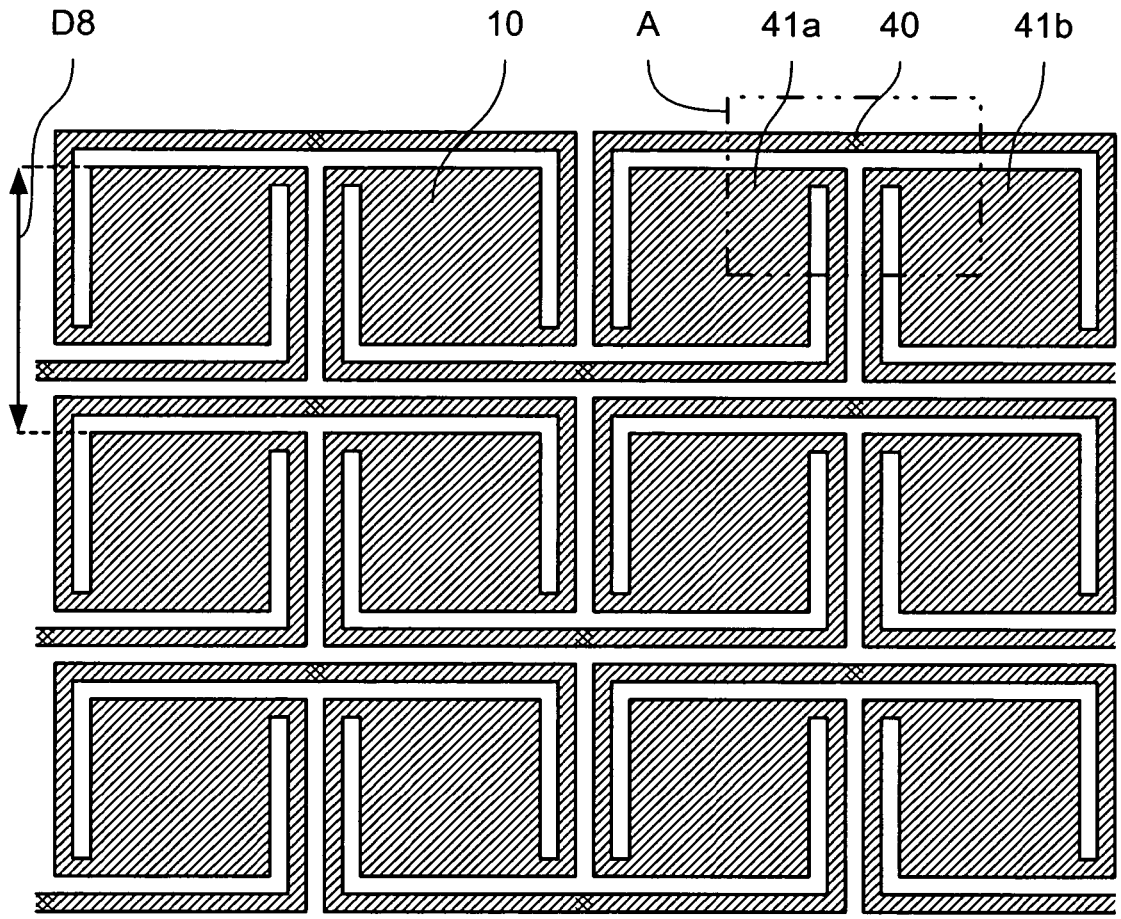

FIGS. 3, 4, and 5a depict arrangements of individually controllable elements arranged in an array, according to various embodiments of the present invention.

Figure 5B:
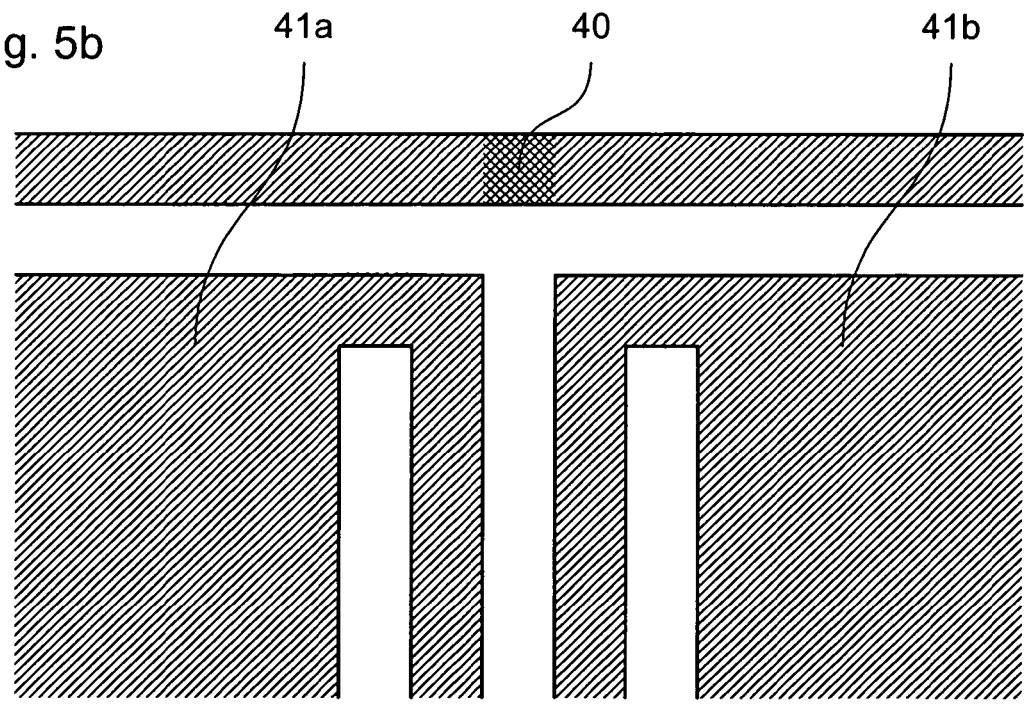

FIG. 5b depicts, in magnified form, the portion of FIG. 5a marked A.

Figure 6A:
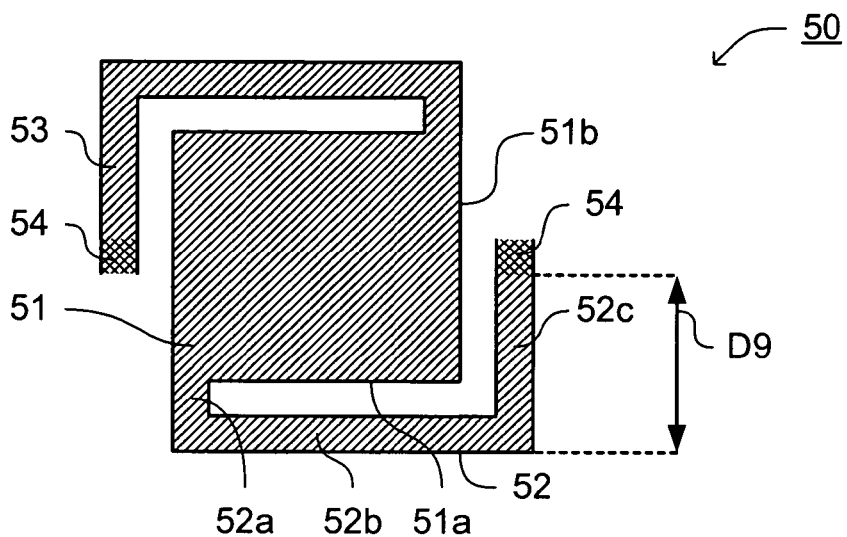

FIG. 6a depicts an individually controllable element, according to one embodiment of the present invention.

Figure 6B:
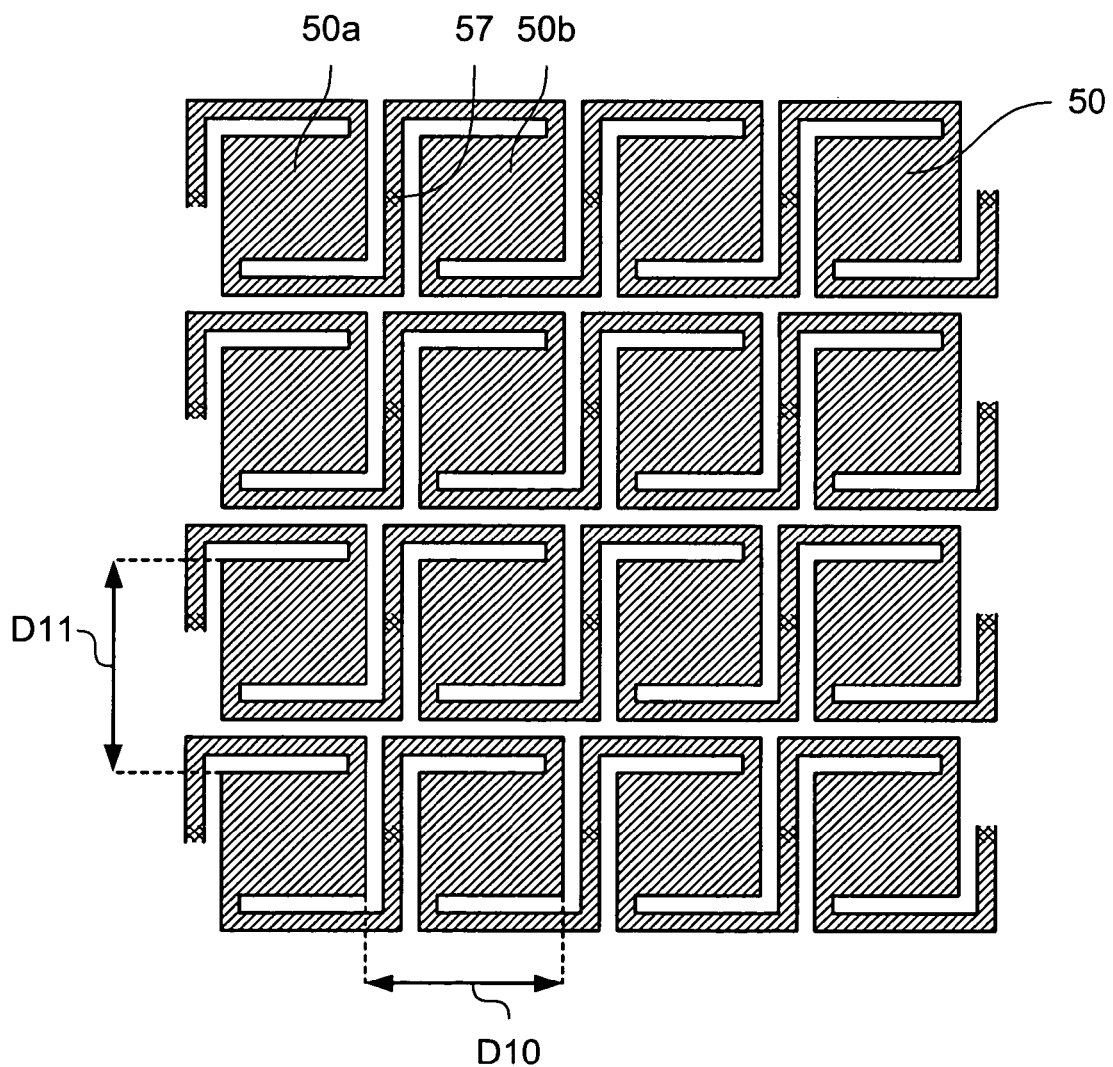

FIG. 6b depicts a plurality of the individually controllable elements of FIG. 6a arranged in an array, according to one embodiment of the present invention.

Figure 7A:
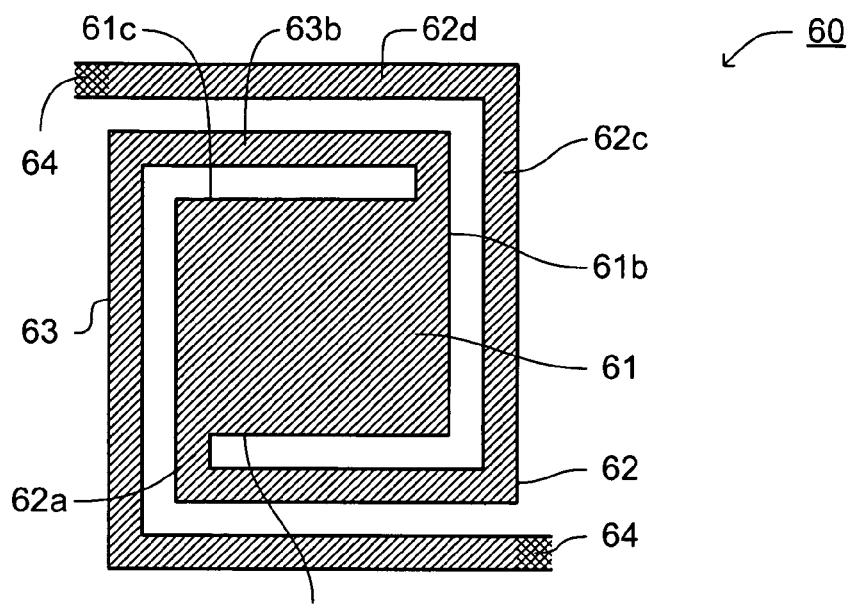

FIG. 7a depicts an individually controllable element, according to one embodiment of the present invention.

Figure 7B:
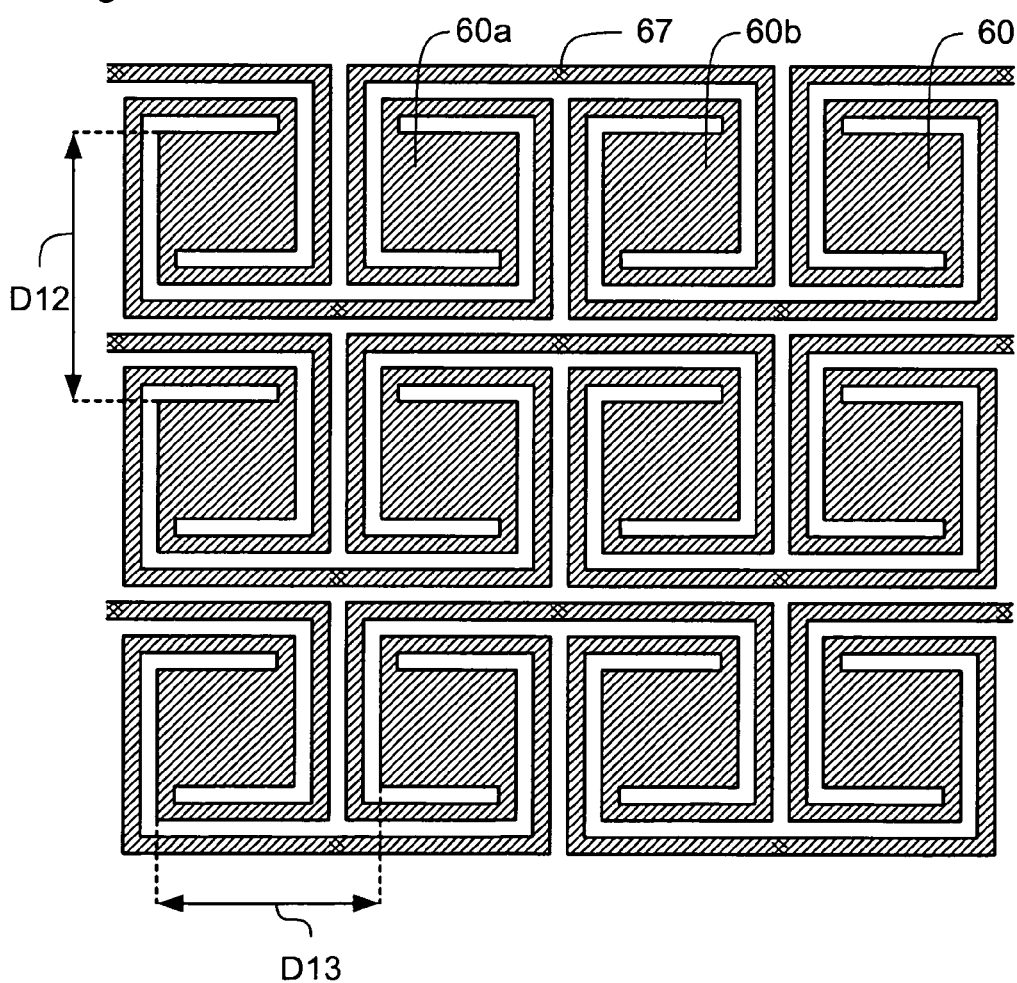

FIG. 7b depicts a plurality of the individually controllable elements of FIG. 7a arranged in an array, according to one embodiment of the present invention.

Figure 8A:
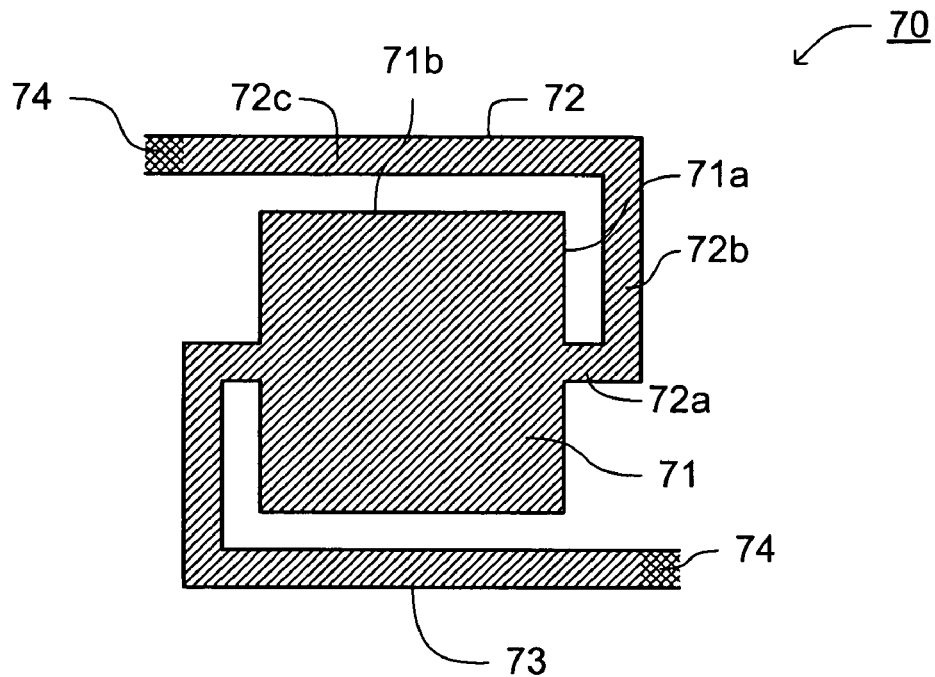

FIG. 8a depicts an individually controllable element, according to one embodiment of the present invention.

Figure 8B:
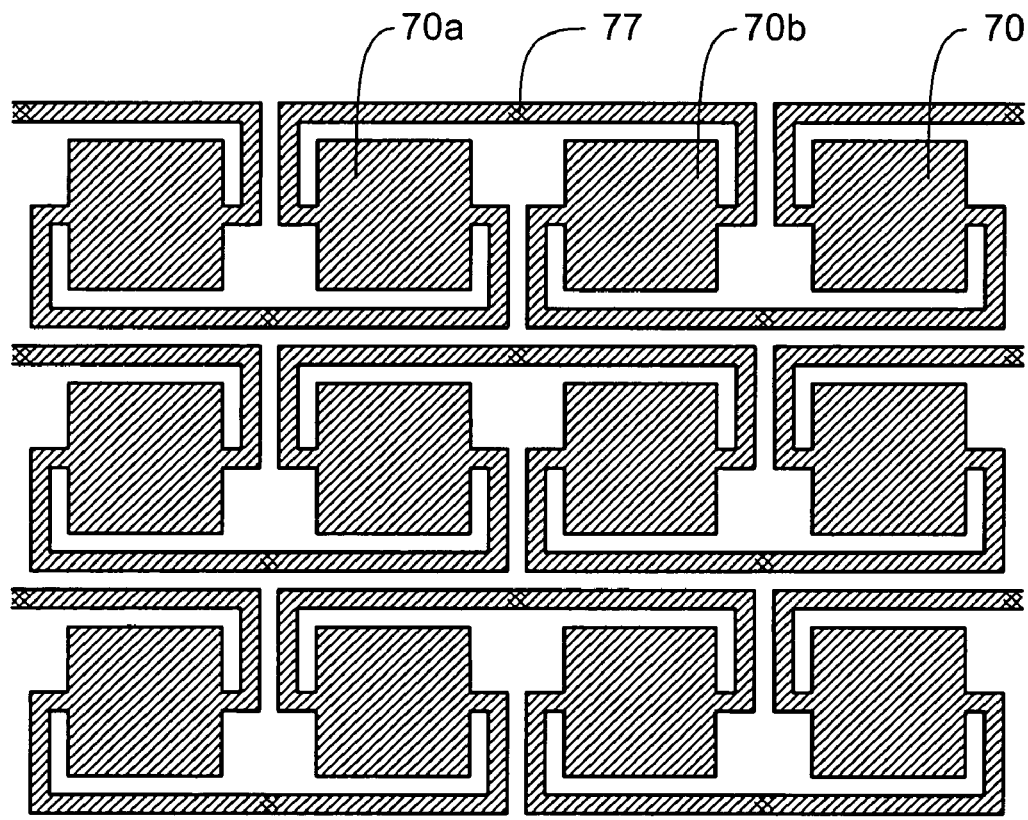

FIG. 8b depicts a plurality of the individually controllable elements of FIG. 8a arranged in an array, according to one embodiment of the present invention.

Figure 9A:
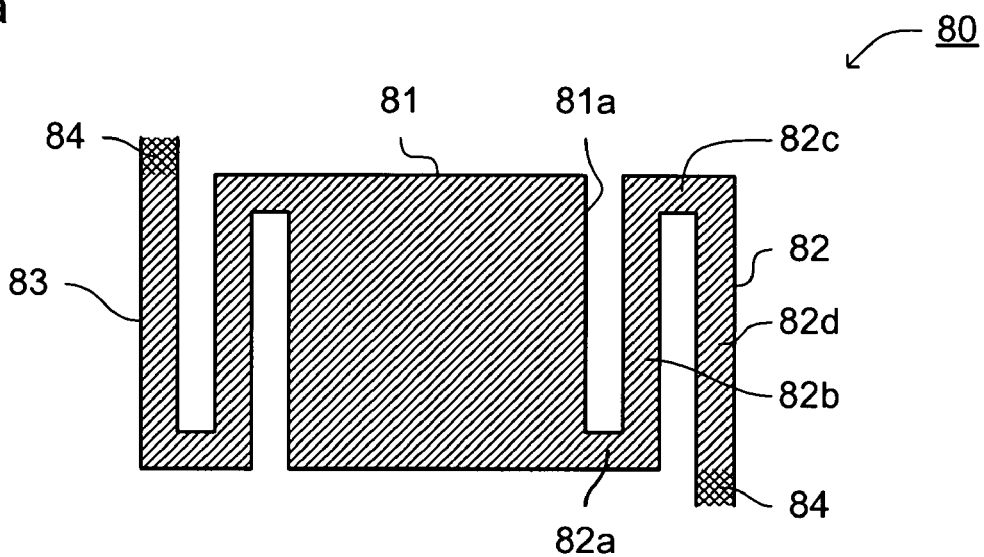

FIG. 9a depicts an individually controllable element, according to one embodiment of the present invention.

Figure 9B:
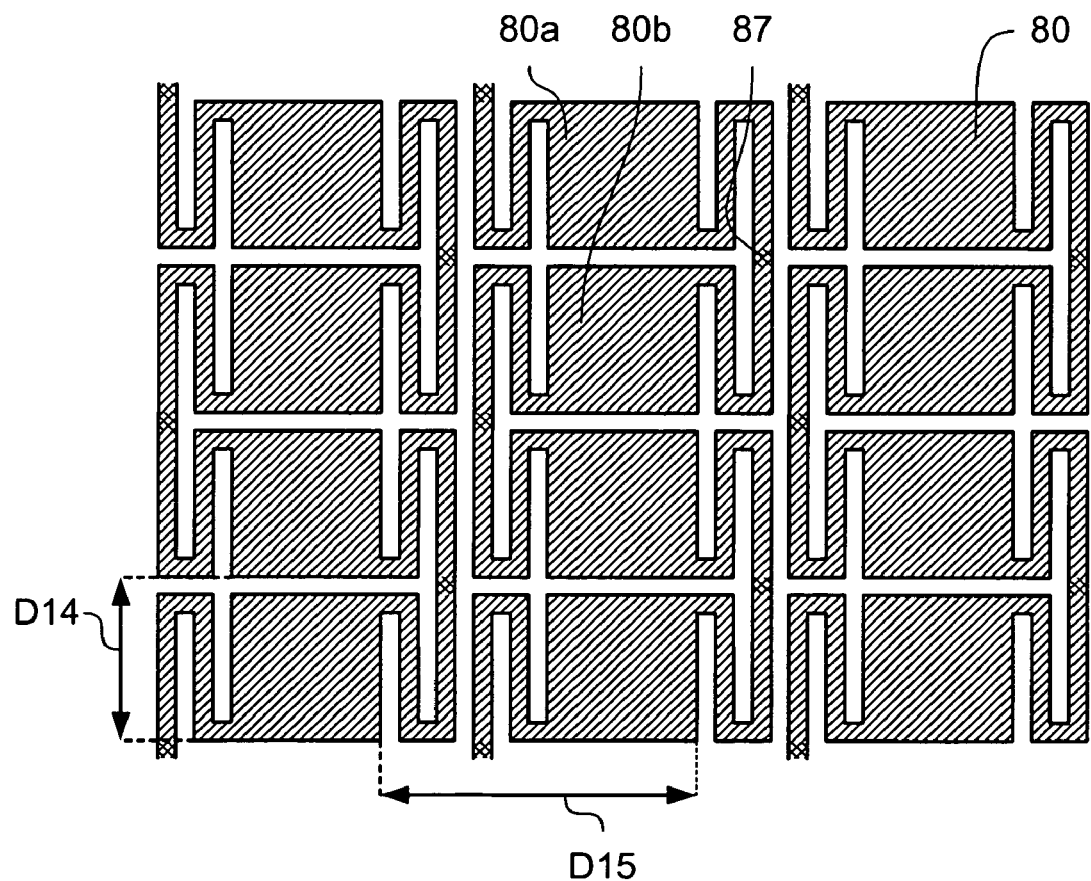

FIG. 9b depicts a plurality of the individually controllable elements shown in FIG. 9a arrange in an array, according to one embodiment of the present invention.

Figure 10A:
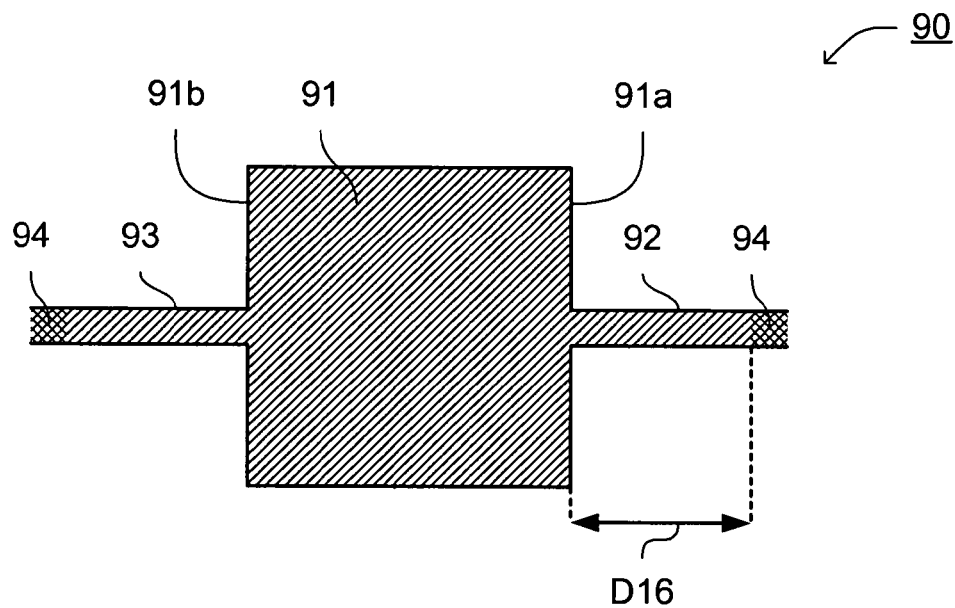

FIG. 10a depicts an individually controllable element, according to one embodiment of the present invention.

Figure 10B:
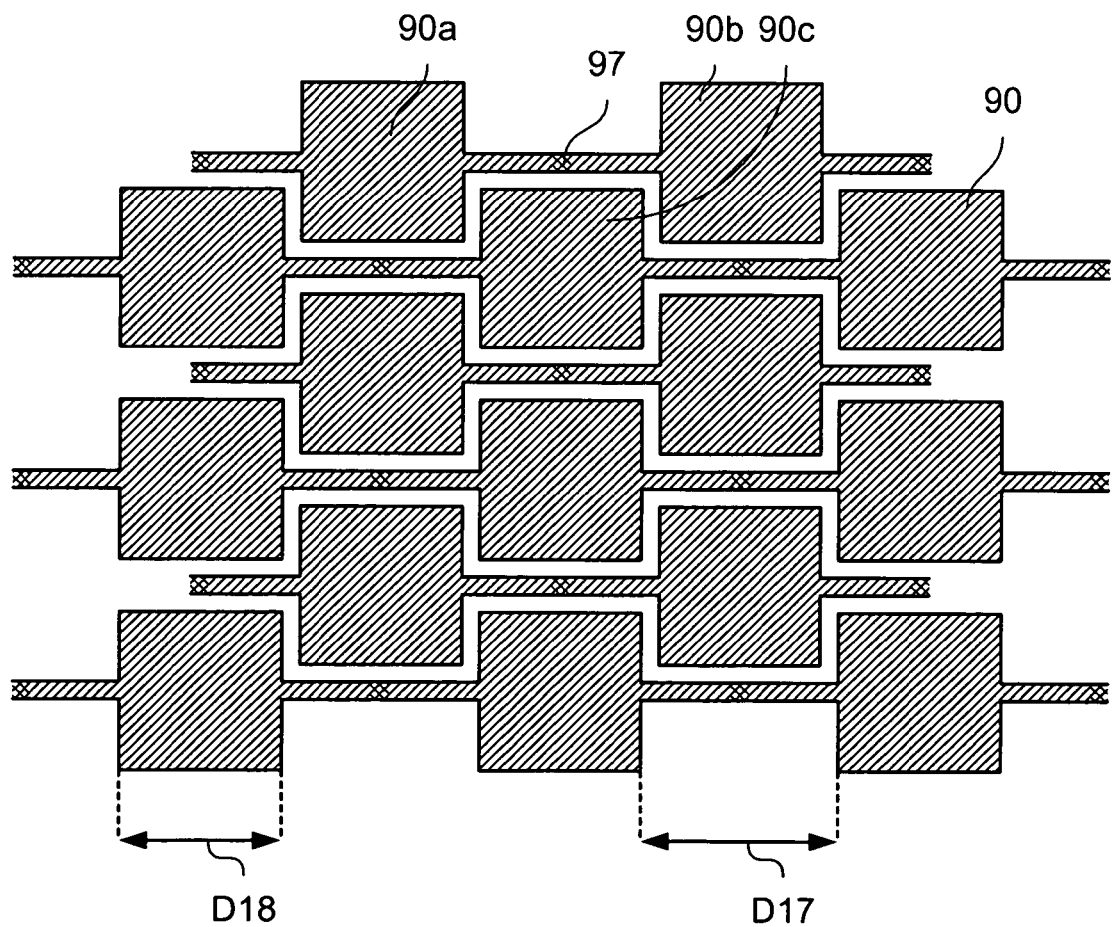

FIG. 10b depicts a plurality of the individually controllable elements of FIG. 10a arranged in an array, according to one embodiment of the present invention.

Figure 11A:
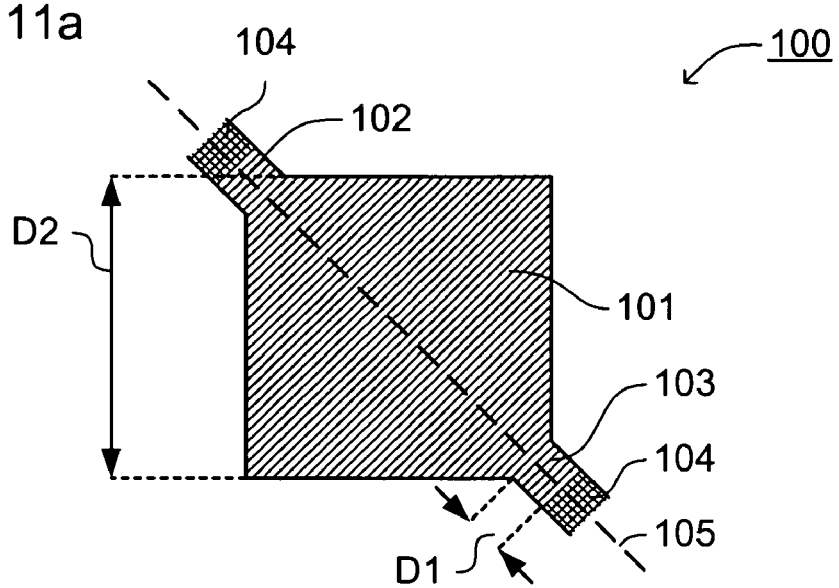

FIG. 11a shows a conventional individually controllable element.

Figure 11B:
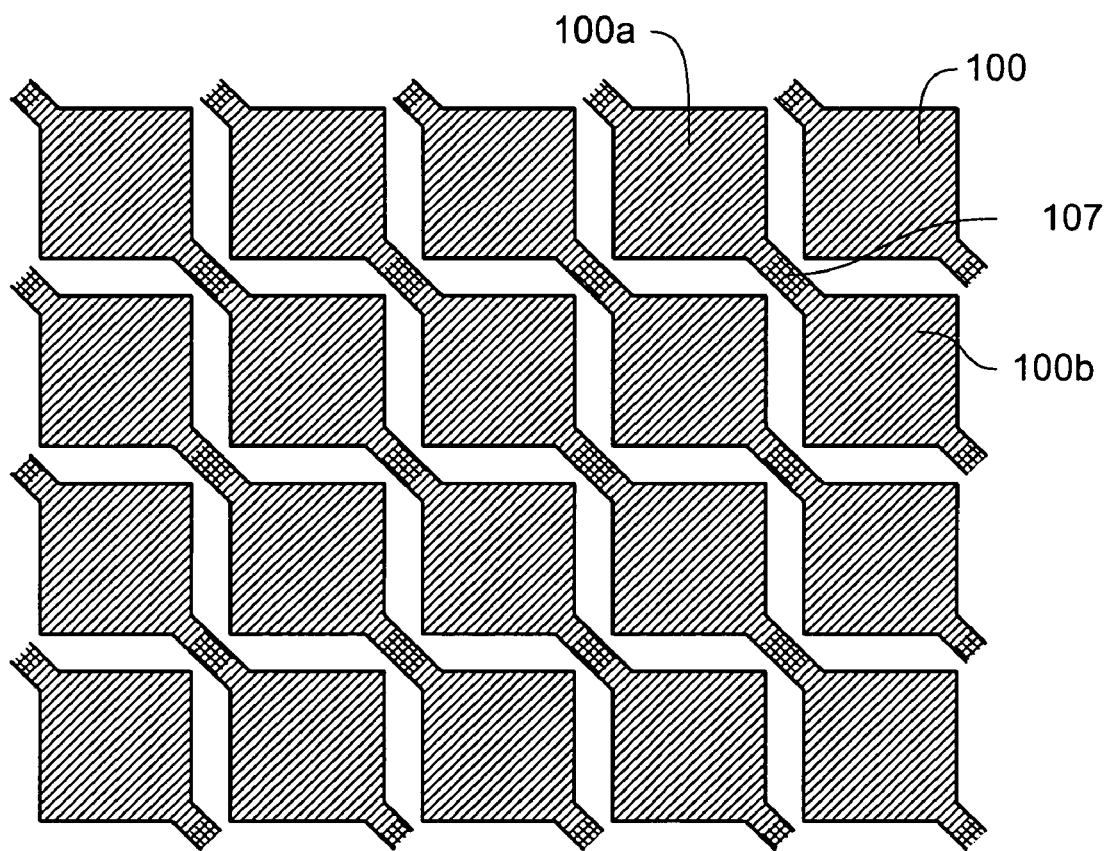

FIG. 11b depicts a plurality of the conventional individually controllable elements shown in FIG. 11a arranged in an array.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
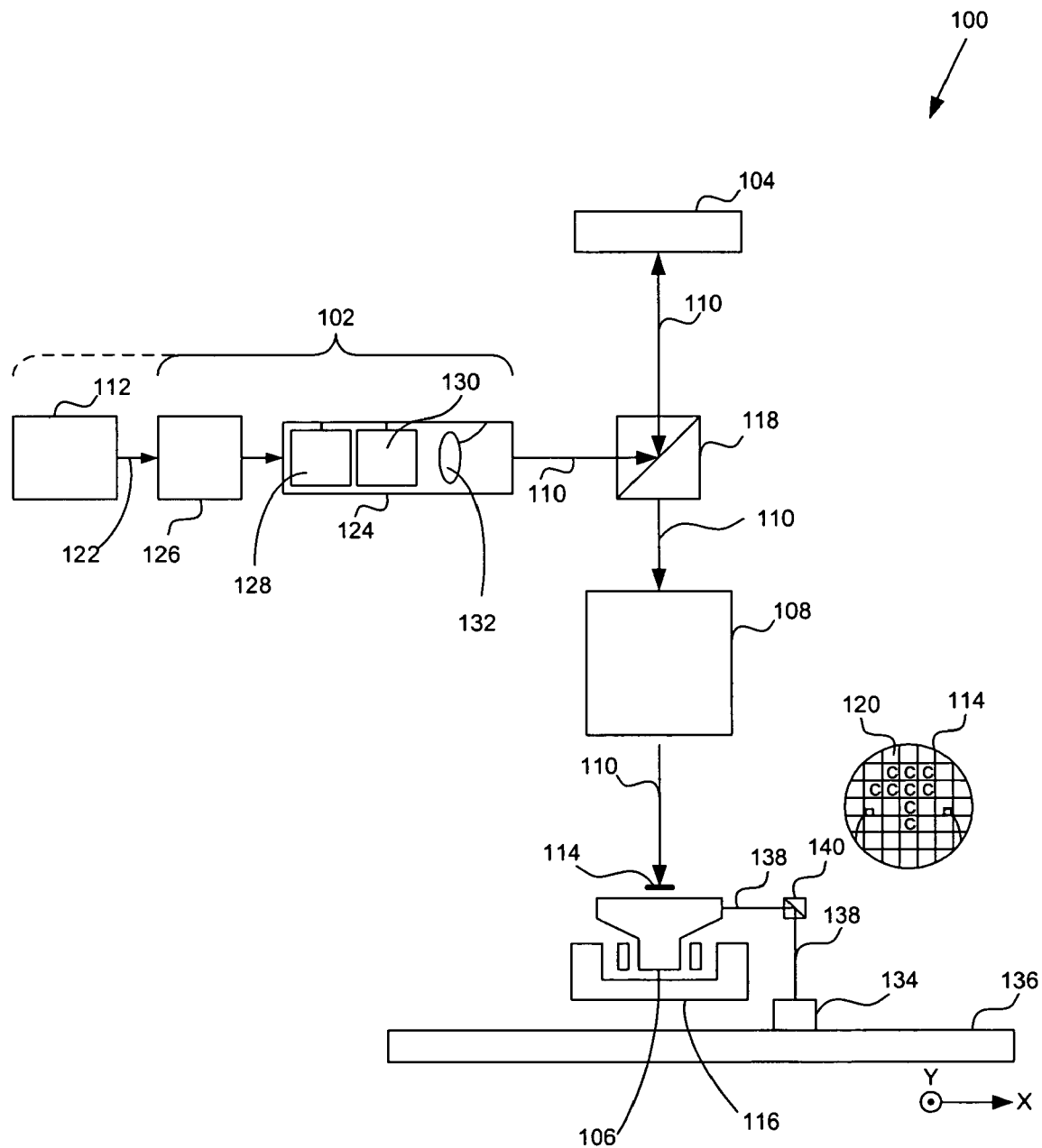
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Conventional Individually Controllable Element

FIG. 11a shows a conventional micro mirror 100 used to form an array of individually controllable elements and FIG. 11b shows a portion of such an array. Each conventional micro mirror 100 is formed from a substantially square planar reflector 101 mounted at a pair of opposite vertices on hinges 102,103 on support sections 104. The micro mirror is actuated to rotate about an axis 105 passing through the hinges 102,103. This causes torsion within the portion of the hinge 102,103 between the planar reflector section 101 and the section of the individually controllable element mounted on the support 104. As shown in FIG. 11a, the length D1 of the hinges 102,103 is significantly shorter than the length D2 of the planar reflector 101 across the plane of reflection.

FIG. 11b shows the conventional micro mirrors 100 arranged in rows and columns adjacent to one another to form the array of individually controllable elements. The hinge sections for two adjacent micro mirrors 100a,100b are mounted together on a common support 107. In order to produce ever-finer features for patterns, it is desirable to reduce the size of the micro mirrors 100 and to reduce the spacing between them in an array. Accordingly, as the size of the planar reflector 101 is reduced, the length of the hinges 102,103 must also be reduced. However, as the length D1 of the hinges decreases, the torsional stress within the hinge to generate a given angular deflection of the planar reflector 101 about the axis 105, increases. Consequently, the force required to actuate the individually controllable element increases and the lifetime of the individually controllable element is decreased due to, for example, fatigue of the hinges 102,103.

Exemplary Elements and Arrays of Same

Figure 2A:
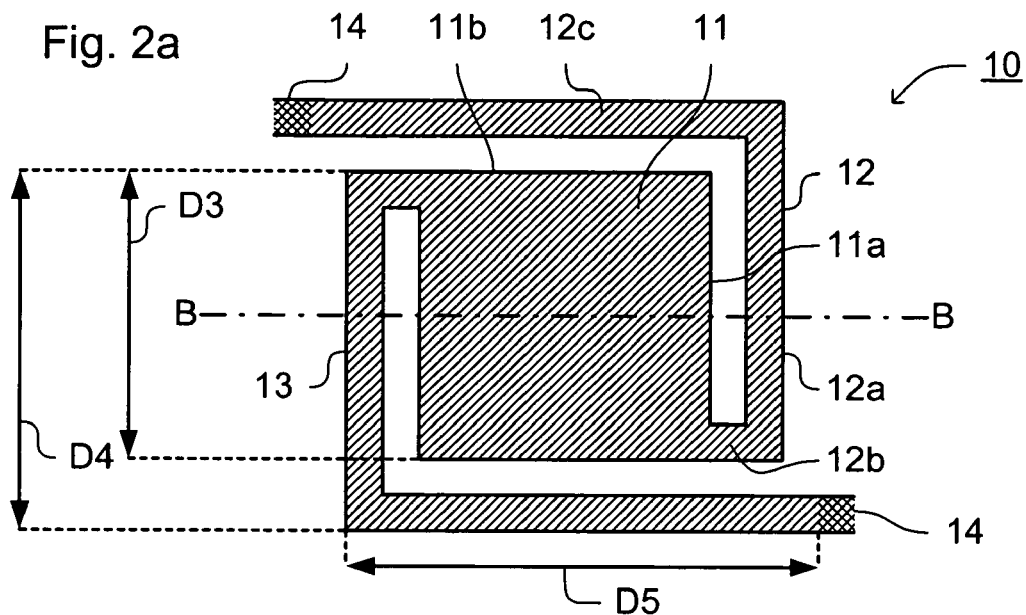
FIGS. 2a, 2b and 2c depict an individually controllable element, according to one embodiment of the present invention.
Figure 2B:
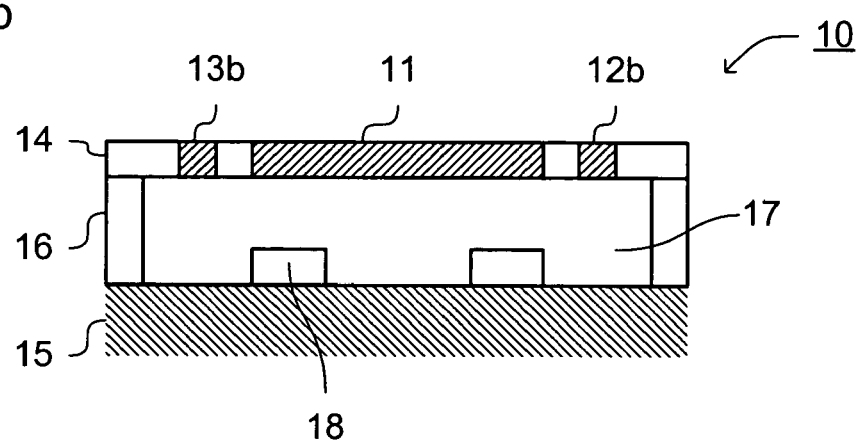
Figure 2C:
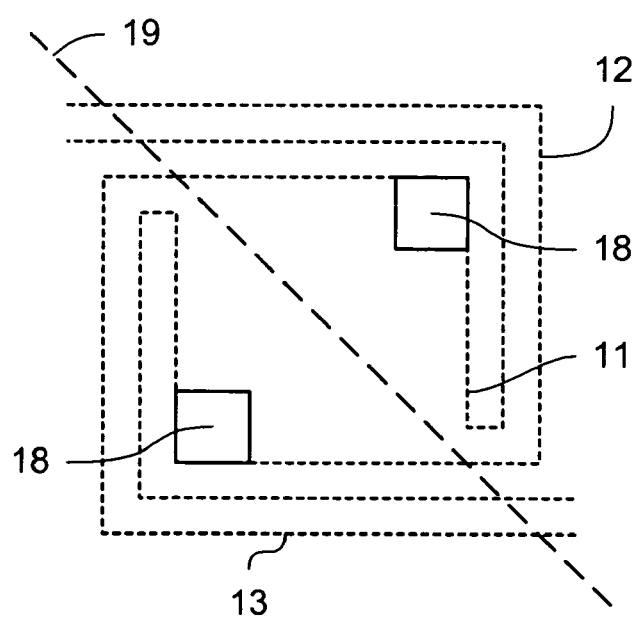

FIGS. 2a, 2b and 2c show an individually controllable element 10, according to one embodiment of the present invention. The individually controllable element 10 includes a substantially square planar reflector 11 mounted on supports 14 by hinges 12,13. It will be appreciated that other shapes of reflectors can also be used, such as, but not limited to, circular, elliptical, polygonal, etc.

As shown, each hinge is elongate. For example, hinge 12 includes a first elongate section 12a and a shoulder portion 12b. The first elongate section 12a is arranged such that its length is substantially parallel to the side 11a of the planar reflector 11 to which it is attached. The shoulder portion 12b connects the first elongate section 12a of the hinge to the planar reflector 11 at the corner connecting the side 11a and its adjacent side. The shoulder portion 12b also establishes an appropriate separation between the first elongate section 12a of the hinge and the planar reflector 11. A second elongate section 12c of the hinge is connected to an opposite end of the first elongate section 12a relative to the end the shoulder section 12b is connected. The second elongate section 12c of the hinge is arranged such that its length is substantially parallel to a second side 11b of the planar reflector and is set apart from the planar reflector 11 by a suitable spacing. The end of the second elongate section 12c of the hinge, other than that connected to the first elongate section 12a of the hinge, is connected to the support 14.

In this example, depending on the size of the shoulder portion 12b, the lengths D4, D5 of the first and second elongate sections 12a, 12c of the hinges, respectively, can be greater than the length D3 of the reflective surface 11. Accordingly, for a given angle of deflection of the planar reflector 11, the stresses in the hinges are lower than would be expected in a conventional micro mirror of a conventional size with a similar size of planar reflector. Furthermore, the stresses in the hinges 12,13 are no longer purely torsional, but include elements of bending stress. This is achieved without significantly increasing the required separation between adjacent individually controllable elements 10 within an array, as will be discussed further below.

In one example, this arrangement allows for forming of arrays of individually controllable elements with finer pitches (allowing formation of finer features within the pattern) without the consequent increase in the stresses in the hinges of the individually controllable elements caused by the reduced size of the hinges. In turn, this eliminates or substantially reduces the lifetime of the hinges (and consequently the individually controllable elements) from becoming uneconomically short and/or eliminates or substantially reduces the actuation force required for each element increasing beyond acceptable levels. The latter can be important because increased actuation forces result in high levels of power being used to control the array of individually controllable elements, which can result in unacceptably high levels of heat needing to be dissipated in order to avoid unwanted thermal effects within the lithographic apparatus.

FIG. 2b shows a cross-section of the individually controllable element 10 across the line BB shown in FIG. 2a, according to one embodiment of the present invention. In this example, the planar reflector 11, the hinges 12,13, and the supports 14 are formed from a single layer of a reflective material, such as aluminum. The support sections 14 are mounted on supports 16 on a substrate 15. Consequently, a space 17 is provided between the substrate 15 and the planar reflector 11. In one example, a device used to actuate the planar reflector 11 can conveniently be arranged within the space 17. In the example shown in FIGS. 2a, 2b and 2c, the device used to actuate the planar reflector 11 is a capacitive actuation system. In such an arrangement, a voltage difference applied between the planar reflector 11 and the electrodes 18 arranged within the space 17 generates an attractive force between the two components. In one example, the planar reflector 11 and the hinges 12,13 of each of the individually controllable elements within an array are maintained at a fixed voltage, and the necessary voltages to create the required actuation for an individually controllable element are supplied to the electrodes 18 by way of control circuitry (not shown) within the substrate 15. The details such control circuitry is beyond the scope of the present invention, but is well known in the SLM art.

FIG. 2c shows a plan view corresponding to FIG. 2a of an individually controllable element, according to one embodiment of the present invention. The outline of the planar reflector 11 and the hinges 12,13 are shown in broken lines, and the relative positions of the control electrodes 18 are shown. In this example, the control electrodes 18 can be arranged at a pair of opposite vertices of the planar reflector 11, other than the vertices to which the hinges 12,13 are connected. Such an arrangement enables the planar reflector 11 to be actuated to rotate about an axis 19 passing between the vertices of the planar reflector 11 to which the hinges 12,13 are connected to the planar reflector 11.

In one example, the individually controllable element of this embodiment allows deflection of the planar reflector linearly instead of, or as well as, rotationally. For example, by applying a voltage to both control electrodes 18 in opposite corners of the planar reflector 11, the planar reflector 11 can move in a direction perpendicular to the plane of reflection of the reflector. In one example, this can allow for a phase shifting array of individually controllable elements in which it is possible to establish a phase difference between the radiation reflected from adjacent individually controllable elements by setting the adjacent planar reflectors 11 to be at different positions, in a direction perpendicular to the reflective plane of the reflectors, relative to the substrate 15 on which they are mounted.

It will be appreciated that alternative configurations of control electrodes 18 can be used to actuate the planar reflector 11. For example, the control system can be simplified by use of a single control electrode 18 if it is only necessary to rotate the planar reflector 11 in a single direction relative to its unactuated position. Similarly, greater control sensitivity can be provided by provision of an additional number of control electrodes 18.

It will further be appreciated that this embodiment of the present invention is not limited to the capacitive actuation, as described above and shown in FIGS. 2a, 2b and 2c. In various examples, due to the greater flexibility of the hinges of the individually controllable element 10, control electrodes 18 can be provided at the vertices of the planar reflector 11 to which the hinges 12,13 are attached, allowing the planar reflector 11 to be rotated about an axis that is perpendicular to the axis 19. In other examples, piezo electric actuators can also be used to actuate the planar reflector 11.

In one example, the individually controllable elements 10 can be formed in the same manner as individually controllable elements using micro mirrors, such as shown in FIGS. 11a and 11b. In one example, a substrate is provided containing the control circuitry necessary to control the actuation devices, for example CMOS circuitry. Metal control electrodes 18 are subsequently formed on the substrate, followed by a sacrificial layer of material. A metal layer is then applied on top of the sacrificial layer to form the planar reflectors 11 and the hinges 12,13. The metal layer is selectively patterned, for example using a lithographic technique, and etched to remove the metal layer from the spaces between the planar reflector 11 and the hinges 12,13 and from between adjacent individually controllable elements 10, as necessary. Subsequently, the sacrificial layer is removed from beneath the planar reflector 11 and the hinges 12,13, which creates the space 17 to enable the planar reflector to be actuated.

In one example, the supports to which the hinges are connected can be formed from a distinct portion of material applied to the substrate before the metal layer. In other examples, the supports 16 can be part of the sacrificial layer that is selectively not removed during the processing technique. In another example, the supports can be formed from and be integral with the metal layer forming the planar reflector 11 and the hinges 12,13.

It will be appreciated that the FIGS. 2a, 2b and 2c are not necessarily to scale. In one example, the separation between the planar reflector 11 and the control electrodes 18 can be substantially smaller than the size of the individually controllable element within the reflective plane. In that example, the ends of the hinges furthest from the planar reflector 11 can be arranged to be angled towards the substrate 15 and be directly connected to it without requiring a separate support section. In one example, it will be appreciated that the width of the elongate sections of the hinges relative to their length is not limited to that shown in the Figures. In another example, although, as shown, the thickness of the hinges can be the same as the thickness of the planar reflector (both measured perpendicular to the plane of the planar reflector), this need not be the case. In particular, the planar reflector can be thicker in order to provide it with greater rigidity. It will further be appreciated that, although all of the features shown in the Figures have sharp corners, in practice the corners of each of the features of the individually controllable elements can be rounded to reduce any stress concentrations.

In one example, the greater length of the hinges 12,13 relative to the size of the planar reflector 11 can result in the natural (unactuated) position of the planar reflectors 11 in each of the individually controllable elements 10 within an array not being the same as each other when no voltages are applied to their respective control electrodes 18. Accordingly, it can be desirable to test the array of individually controllable elements and determine offsets to be applied to each of the control electrodes 18 within the array of individually controllable elements. This can be done to ensure that each of the planar reflectors are sufficiently consistent with one another in their locations when no pattern is set on the array of individually controllable elements or a particular portion of the array of individually controllable elements.

FIGS. 3, 4, and 5a depict arrangements of individually controllable elements arranged in an array, according to various embodiments of the present invention. FIG. 5b depicts, in magnified form, the portion of FIG. 5a marked A. In these examples, the individually controllable elements 10 can be configured in a plurality of ways to form an array of individually controllable elements. Each column 21a,21b,21c of individually controllable elements 10 is associated with a pair of elongate supports 20a,20b,20c,20d, to which each of the individually controllable elements is attached in order to mount them on the array of individually controllable elements.

As shown in FIG. 3, elongate supports 22 are also provided between the individually controllable elements in the direction perpendicular to the columns 21a,21b,21c of individually controllable element 10. In the arrangement shown in FIG. 3, the supports 22 do not perform a specific support function. However, in one example they can provide some additional rigidity to the supports 20a,20b,20c,20d that are used. In one example, they ensure that the separation D6 between the individually controllable elements 10 along the direction of the column 21a,21b,21c is the same as the separation D7 between the columns 21a,21b,21c of individually controllable elements. This may be necessary to simplify the control of the patterns provided to the arrays of individually controllable elements. It will be appreciated that, in one example, the supports 22 between the rows of individually controllable elements 10 can be omitted.

FIG. 4 shows an alternative configuration of an array of individually controllable elements 10, compared to that shown in FIG. 2a. In this case, individual supports 30 are provided and are connected to the hinges of four individually controllable elements 31a,31b,31c,31d arranged around the support. The four individually controllable elements can be arranged in two adjacent rows each of two adjacent individually controllable elements. In one example, the arrangement of the four individually controllable elements is in a square configuration if the individually controllable elements are themselves square.

The support 30 is arranged at the center of the configuration. It should be noted that in order to provide this configuration for individually controllable elements such as shown in FIG. 2a, two of the individually controllable elements, in this case the individually controllable elements denoted 31b and 31d, are mirror images of the individually controllable element shown in FIG. 2a and the other individually controllable elements 31a,31c connected to the support 30. The other hinges of the individually controllable elements 31a,31b,31c,31d, other than those connected to the support 30 in the middle of that group of individually controllable elements, are each connected to other supports located in the middle of another group of four individually controllable elements. In this example, the supports at the edge of the array of individually controllable elements will not be connected to the hinges of four individually controllable elements.

The arrangement shown in FIG. 4 compared to the arrangement of the individually controllable elements shown in FIG. 3 can allow the separation D8 between the individually controllable elements 10 to be is less than the separation D6,D7 between the individually controllable elements of that configuration. The hinges of the individually controllable elements in the arrangement in FIG. 4 are slightly shorter than the hinges of the individually controllable elements of the arrangement shown in FIG. 3 resulting in slightly higher stresses in the hinges for individually controllable elements of a comparable size.

FIG. 5a shows a further alternative arrangement of the individually controllable elements 10 of FIG. 2a. For clarity, FIG. 5b shows a magnified portion, denoted A in FIG. 5a, of a portion of the arrangement. As shown, pairs of adjacent individually controllable elements 41a,41b are connected at a common support 40. In order to achieve this, the adjacent individually controllable elements 41a,41b are mirror images of each other. The separation D8 of the individually controllable elements 10 is the same as in the arrangement shown in FIG. 4. However, each of the supports 40 is smaller (correspondingly there are a greater number of the supports 40), enabling the hinges of the individually controllable elements to be slightly longer than those of the individually controllable elements shown in FIG. 4 (consequently slightly reducing the stress in the hinges). However, the relative decreased size of the supports 40 can result in the configuration being less rigid then the configurations shown in FIGS. 3 and 4 and, consequently, motion of one individually controllable element can be transmitted to the connected individually controllable element resulting in cross-talk.

In relation to the arrangements shown in FIGS. 3, 4, 5a and 5b, it is to be appreciated that in one example each of the planar reflectors, each of the hinges, and each of the supports (or at least part of the supports) can be formed simultaneously by the deposition of a single metal layer and subsequent etching to remove the unneeded parts of the metal layer. Accordingly, the supports and hinges connected to them (and planar reflectors connected to the hinges) can be a single integral component. In another example, to reduce a cross-torque between the individually controllable elements, some or all of the components can be formed as separate elements.

It will also be appreciated that other configurations than those shown in FIGS. 3, 4, 5a and 5b can be used to combine the individually controllable elements shown in FIG. 2a to form an array of individually controllable elements and the invention is not limited to the configurations shown.

FIG. 6a depicts an alternative individually controllable element 50, according to one embodiment of the present invention. The individually controllable element is comprised of a planar reflector 51 and hinges 52,53 connecting the planar reflector 51 to supports 54. As with the individually controllable element 10 shown in FIG. 2a, the individually controllable element 50 shown in FIG. 6a is arranged such that its elongate hinge 52 has a first elongate section 52b connected to a vertice of the planar reflector 51 by means of a shoulder section 52a. The elongate direction of the first elongate section 52b of the hinge is substantially parallel to the side 51a of the planar reflector 51 to which the hinge 52 is attached and a suitable separation is provided between the side 51a of the planar reflector 51 and the first elongate section 52b of the hinge. A second elongate 52c section of the hinge is connected between the first elongate section 52b of the hinge and the support 54. As with the arrangement of the individually controllable element 10 shown in FIG. 2a, the second elongate section 52c of the hinge is arranged such that its elongate section is parallel to a second side 51b of the planar reflector 51 (and at a suitable separation from the planar reflector 51).

In contrast to the arrangement of the individually controllable element 10 shown in FIG. 2a, the length D9 of the second section 52c of the hinge of the individually controllable element 50 is only such that the support 54 is arranged substantially midway along the side of the planar reflector 51 to which the second section 52c of the hinge is parallel. Consequently, the total length of the hinge 52 is shorter than the hinge 12 of the individually controllable element 10 shown in FIG. 2a for a given side of planar reflector 51. Consequently, the stress in the hinge, for a given size of planar reflector and a given angle of deflection of the planar reflector, will be larger but, as shown in FIG. 6b, the separation between the individually controllable elements 50 in an array of individually controllable elements can be smaller.

FIG. 6b shows a portion of an array of individually controllable elements comprising individually controllable elements 50 as shown in FIG. 6a in a configuration corresponding to that shown in FIG. 5a, according to one embodiment of the present invention. Pairs of adjacent individually controllable elements 50a,50b are connected to a support 57. As shown, the separation D10 between individually controllable elements 50 in a direction that includes the supports 57 between adjacent individually controllable elements is smaller, for a corresponding size of planar reflector, than the corresponding separation D8 in the arrangement shown in FIG. 5a. However, separation D11 between adjacent individually controllable elements 50 in a direction that does not include the supports 57 between adjacent individually controllable elements is the same as the corresponding separation D8 between the individually controllable elements in the arrangement shown in FIG. 5a and larger than the separation D10.

If it is desirable to maintain the same separation between the individually controllable elements in each direction, then additional space can be used, for example, between the individually controllable elements to provide supports with greater rigidity, thereby reducing any cross-talk between adjacent individually controllable elements.

FIG. 6a shows an arrangement of the present invention in which the elongate hinges connecting the planar reflector to the supports are shorter (relative to the size of the planar reflector) than those shown in the exemplary embodiment of the invention shown in FIG. 2a. In general, the hinges can be even shorter than those shown in FIG. 6a, provided the hinges are sufficiently long that the stresses within the hinges are within adequate limits when the planar reflector is actuated.

FIG. 7a shows an individually controllable element 60, in which longer hinges relative to the size of the planar reflector than those provided for the embodiment shown in FIG. 2a is used, according to one embodiment of the present invention. The individually controllable element 60 has a planar reflector 61 and hinges 62,63 connected to support 64. The hinges 62 have first, second and third elongate sections 62b,62c,62d, connected by a shoulder section 62a to ensure the required separation of the hinges 62,63 from the planar reflector 61 and the adjacent individually controllable elements. Each of the elongate sections of 62b,62c, 62d of the hinge are arranged, such that the elongate direction of the sections are parallel to first, second and third 61a,61b,61c sides, respectively, of the planar reflector 61. The first elongate section 62b of the hinge is arranged parallel to the side 61a of the planar reflector 61 to which the hinge 62 is attached. The third elongate section 62d of the hinge 62 is also parallel to the first elongate section 63b of the second hinge 63 (which is connected to the third side 61c of the planar reflector). A separation is provided between the third elongate section 62d of the first hinge 62 and the first elongate section 63b of the second hinge 63.

FIG. 7b shows how a portion of an array of individually controllable elements 60 such as that shown in FIG. 7a can be arranged, according to one embodiment of the present invention. In a corresponding manner to FIGS. 5a and 6b, pairs of adjacent individually controllable elements 60a and 60b are connected to a single support section 67. As with the discussion above of an individually controllable element with hinges shorter (relative to the size of the planar reflector) than those of the individually controllable element shown in FIG. 2a, the configuration of the individually controllable elements 60 with longer hinges can have an impact on the separation of the individually controllable elements within the array. For example, the separation D12 of the planar reflectors in a first direction is greater than the separation D13 of the planar reflectors within adjacent individually controllable elements in a second direction, orthogonal to the first direction. As before, if required, the individually controllable elements can be distributed to provide more space between them in the second direction such that the separations D12,D13 are the same. The additional space can, for example, be used to provide a rigid support 67.

In general, it will be appreciated that there is no specific limit to the length of the hinges that can be used. In one example, individually controllable elements can be used in which additional elongate sections of the hinge are included, being arranged to successively surround the planar reflector and the portions of the hinges that are closer to the end of the hinge that is attached to the planar reflector.

It one example, the stresses within the hinge for a given size of planar reflector and a given required angular displacement of the planar reflector are reduced as the length of the hinge becomes longer relative to the size of the planar reflector. However, the separation between adjacent planar reflectors increases as the hinges become longer. Also, if the hinges are integrally formed with the planar reflector, they will also be reflective. When the individually controllable element is actuated, the hinges are not actuated to the same extent as the planar reflector. Consequently, the hinges are a portion of the individually controllable element that are not switched between different states. The larger the portion of the individually controllable element that the hinges form (namely the longer the hinges are relative to the size of the planar reflector), the less the contrast in the pattern formed that can be achieved by the individually controllable element. The impact on the available contrast of the lengthening hinges is likely to form the practical limit to the length of hinge used.

Although one or more embodiments and/or examples of the present invention have been described above with reference to an arrangement in which the hinges of the individually controllable elements are connected to vertices of the planar reflector, it should be appreciated that the invention is not limited to such arrangements.

FIG. 8a shows an individually controllable element 70, according to one embodiment of the present invention. In this embodiment, the hinges 72,73 are connected to the planar reflector 71 at the mid points of two opposite sides of the planar reflector 71. Each hinge has a shoulder section 72a connecting a first elongate section 72b of the hinge to the side of the planar reflector 71 and providing an adequate separation between the first elongate section 72b of the hinge and the planar reflector. The other end of the first elongate section 72b of the hinge is connected to a second elongate section of the hinge 72c, which is in turn connected to the support 74 for mounting the individually controllable element on the substrate. The first elongate section 72b of the hinge is arranged, such that its length is substantially parallel to the edge 71a of the planar reflector 71 to which the hinge is attached and the section elongate section 72c of the hinge is substantially perpendicular to the first elongate section 72b of the hinge and arranged parallel to a second side 71b of the planar reflector 71.

FIG. 8b shows a configuration of an array of individually controllable elements incorporating individually controllable elements 70, such as shown in FIG. 8a, according to one embodiment of the present invention. Pairs of adjacent individually controllable elements 70a,70b (that are mirror images of each other) are connected to a common support 77.

In one or more embodiments and/or examples described above, the arrangements of individually controllable elements have been arranged, such that successive elongate sections of the hinges are perpendicular to each other and arranged adjacent to (or at least parallel to) successive sides of the planar reflector. However, the invention is not limited to such arrangement.

FIG. 9a shows an arrangement of an individually controllable element 80, according to one embodiment of the present invention. The individually controllable element 80 has a planar reflector 81 and hinges 82,83 connecting the planar reflector to supports 84. In this case, each hinge has a shoulder portion 82a connecting one vertice of the planar reflector 81 to a first elongate portion 82b of the hinge which is arranged such that its length is parallel to the side 81a of the planar reflector 81 to which the hinge is connected. A second elongate section 82d of the hinge is connected to the support 84. However, in contrast to the arrangement shown in FIG. 2a, for example, the second elongate section 82b of the hinge is also arranged such that its elongate direction is parallel to the side 81a of the planar reflector 81 to which the hinge is connected. The second elongate section 82d of the hinge is connected to the first elongate section 82b by means of an elbow section 82c.

FIG. 9b shows how a plurality of the individually controllable elements, such as shown in FIG. 9a, are arranged together to form an arrangement of individually controllable elements, according to one embodiment of the present invention. Pairs of adjacent individually controllable elements 80a,80b (which are mirror images of each other) are connected by common supports 87. It will be appreciated, however, that such arrangements can be undesirable because the separation D14 in a first direction, corresponding to the separation between pairs of individually controllable elements 80a,80b that share a common support 87 is significantly smaller than the separation D15 between adjacent individually controllable elements in a second direction, orthogonal to the first direction.

In one or more embodiment and/or examples described above, individually controllable elements have been described in which at least the first elongate section of the hinge is parallel to the side of the planar reflector to which the hinge is connected. However, it is to be understood that the present invention is not limited to such arrangements.

FIG. 10a shows an individually controllable element 90, according to one embodiment of the present invention. The controllable element 90 comprises a planar reflector 91 and is connected by way of elongate hinges 92,93 to support 94. The hinges 92,93 are connected to the mid points of opposite sides 91a,91b of the planar reflector 91. The hinges 92, 93 are arranged such that the elongate direction of the hinges 92,93 are perpendicular to the respective sides 91a,91b of the planar reflector 91 to which they are attached.

FIG. 10b shows a configuration of an array of the individually controllable elements 90 shown in FIG. 10a, according to one embodiment of the present invention. Pairs of individually controllable elements 90a,90b are connected to a common support 97 such that the hinges of the two individually controllable elements are aligned with each other. A third individually controllable element (which is not connected to any supports in common with the first pair of individually controllable elements 90a,90b) is arranged such that part of the planar reflector of the third individually controllable element 90c is within a space defined by the connected hinges of the pair of individually controllable elements 90a,90b and the sides of the planar reflectors of the first pair of individually controllable elements 90a,90b to which the mutually connected hinges of the pair of individually controllable elements are connected. In a corresponding manner, part of the edge of each of the planar reflectors of the first pair of individually controllable elements 90a,90b, connected to the sides of those planar reflectors to which their hinges are connected, is arranged adjacent to one of the hinges, respectively, of the third individually controllable element 90c.

In this embodiment, the length of D16 of the hinges of the individually controllable element 90 of the arrangement shown in FIG. 10a can be up to half the separation D17 between the adjacent edges of planar reflectors of individually controllable elements that share a common support. This separation D17 between edges of connected individually controllable elements can be at least the width D18 of the planar reflectors of the individually controllable elements. Consequently, the length D16 of the hinges can be at least half the width D18 of the planar reflectors. This length of a hinge (relative to the size of the planar reflector) is still significantly larger than the length of a hinge of the known individually controllable elements without requiring a significant increase in the spacing of the individually controllable elements. The individually controllable elements, such as shown in FIG. 10, can also have also have greater stability of control than the individually controllable elements shown in FIG. 2a, for example, if the individually controllable element is only to be actuated to rotate about a rotation axis.

It will be appreciate that although the exemplary individually controllable elements shown in FIGS. 6a, 7a, 8a, 9a and 10a are only shown with a single corresponding arrangement of the individually controllable elements to form an array of individually controllable elements, each of these individually controllable elements can be configured in alternative ways to form arrays of individually controllable elements in the same way that the individually controllable elements shown in FIG. 2a can be arranged into arrays of individually controllable elements at least as shown in FIGS. 3, 4 and 5a.

It will also be appreciated that in general, the longer the hinge is used with the planar reflector, the lower the stresses within the hinge for a given size of the planar reflector and a given angle of rotation of the planar reflector. In one example, the hinges used are at least half of the smallest dimension of the planar reflector within the reflecting plane. In another example, the hinges used can be at least a size of the smallest dimension of the planar reflector across the reflecting plane. In a further example, the hinges are at least twice the size of the smallest dimension of the planar reflector across the reflecting plane.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all, exemplary embodiments of the present invention as contemplated by the inventor(s), and thus, are not intended to limit the present invention and the appended claims in any way.

What is claimed is:

1. A lithographic apparatus, comprising:
   an illumination system that supplies a beam of radiation;
   an array of individually controllable elements that pattern the beam; and
   a projection system that projects the patterned beam onto a target portion of a substrate,
   wherein the array of individually controllable elements includes a substrate having a plurality of supports on which the individually controllable elements are mounted,
   wherein the individually controllable elements each comprise,
      a planar reflector, having a reflective surface substantially located in a reflecting plane, and
      at least two hinges each having an elongated portion, wherein the hinges are each connected at one end to the planar reflector and at the other end to one of the supports on the substrate;
   wherein the length of the hinges, between the connections to the planar reflector and the support, is at least one of:
      (a) half of a smallest dimension of the planar reflector across the reflecting plane, (b) equal to the smallest dimension of the planar reflector across the reflecting plane and (c) twice the smallest dimension of the planar reflector across the reflecting plane.

2. The apparatus of claim 1, wherein each hinge comprises at least first and second ones of the elongate portions arranged such that the elongate directions of the first and second ones of the elongate portions are substantially parallel to first and second edges of the planar reflector, respectively.

3. The apparatus of claim 1, wherein at least a part of the elongate portion of each hinge is arranged such that an elongate direction of each elongate portion is substantially perpendicular to an edge of the planar reflector to which each elongate portion is connected.

4. The apparatus of claim 1, wherein each of the supports is connected to respective first and second ones of the at least two hinges that are connected, respectively, to first and second ones of the planar reflectors that are adjacent each other.

5. The apparatus of claim 1, wherein each of the supports are connected to respective first to fourth ones of the at least two hinges that are connected, respectively, to first to fourth ones of the planar reflectors, the first to fourth ones of the planar reflectors being arranged to form two adjacent rows each of two adjacent ones of the planar reflectors.

6. The apparatus of claim 1, wherein each of the supports are connected to a plurality of the at least two hinges that are connected to a plurality of the planar reflectors arranged substantially in a row.

7. The apparatus of claim 6, wherein the planar reflectors and the connected hinges are integrally formed from the same material.

8. The apparatus of claim 7, wherein two or more of the at least two hinges connected to a common one of the supports are integrally formed from the same material.

9. The apparatus of claim 1, wherein the individually controllable elements further comprise:
   an actuator that actuates the associated individually controllable element, such that the individually controllable element rotates about an axis arranged substantially within the reflecting plane.

10. The apparatus of claim 1, wherein the individually controllable elements ftirther comprise:
    an actuator that actuates the associated individually controllable element, such that the individually controllable element translates in a direction substantially perpendicular to the reflecting plane.

11. An array of individually controllable elements, configured to pattern a beam of radiation, comprising:
    a plurality of individually controllable elements, each comprising,
       a planar reflector having a reflective surface substantially located in a reflecting plane, and
       at least two elongate hinges, and
    a substrate having a plurality of supports on which the individually controllable elements are mounted,
    wherein the hinges are each connected at one end to the planar reflector and at the other end to one of the supports on the substrate;
    wherein a length of the hinges is at least one of (a) half of a smallest dimension of the planar reflector across the reflecting plane, (b) eciual to the smallest dimension of the planar reflector across the reflecting plane and (c) twice the smallest dimension of the planar reflector across the reflecting plane.

12. A device manufacturing method comprising:
    mounting a plurality of individually controllable elements on a plurality of supports on a substrate to form an array of individually controllable elements, wherein each individually controllable element includes a planar reflector;
    connecting a first hinge to each of the individually controllable elements and to its associated planar reflector and a second hinge to each of the individually controllable elements and to one of the supports on the substrate, a length of the first and second hinges being at least one of (a) half of a smallest dimension of the planar reflector across a reflecting plane, (b) equal to the smallest dimension of the planar reflector across the reflecting plane and (c) twice the smallest dimension of the planar reflector across the reflecting plane thereof;
    patterning a beam of radiation using the array of individually controllable elements; and
    projecting the patterned beam of radiation onto a target portion of a substrate.

13. The method of claim 12, further comprising:
    actuating the planar reflectors to position them as necessary to impart the pattern to the beam.

* * * * *

UNITED STATES PATENT AND TRADEMARK OFFICE
CERTIFICATE OF CORRECTION

PATENT NO. : 7,355,677 B2
APPLICATION NO. : 11/007588
DATED : April 8, 2008
INVENTOR(S) : Dirk-Jan Bijvoet It is certified that error appears in the above-identified patent and that said Letters Patent is hereby corrected as shown below:

Column 18

Line 21, replace "ftirther" with --further--.

Line 40, replace "eciual" with --equal--.

Signed and Sealed this

Nineteenth Day of August, 2008

JON W. DUDAS
*Director of the United States Patent and Trademark Office*